United States Patent [19]

Gheewala et al.

[11] Patent Number: 4,937,826
[45] Date of Patent: Jun. 26, 1990

[54] METHOD AND APPARATUS FOR SENSING DEFECTS IN INTEGRATED CIRCUIT ELEMENTS

[75] Inventors: Tushar R. Gheewala, Cupertino; Robert J. Lipp, Los Gatos, both of Calif.

[73] Assignee: CrossCheck Technology, Inc., San Jose, Calif.

[21] Appl. No.: 242,848

[22] Filed: Sep. 9, 1988

[51] Int. Cl.$^5$ ............................................. G06F 11/00
[52] U.S. Cl. .................................. 371/22.1; 371/21.4; 371/15.1
[58] Field of Search ............... 371/22.1, 22.2, 22.4, 371/22.5, 22.6, 15.1, 25.1, 24, 21.4; 324/73 R, 73 AT; 365/203

[56] References Cited

U.S. PATENT DOCUMENTS

| | | | |
|---|---|---|---|
| 4,592,026 | 5/1986 | Matsukawa | 365/203 |
| 4,672,610 | 1/1987 | Salick | 371/27 |
| 4,739,250 | 4/1988 | Tanizawa | 371/22.2 |
| 4,749,947 | 6/1988 | Gheewala | 371/22.6 X |

OTHER PUBLICATIONS

"Fault Coverage Requirement in Production Testing of LSI Circuits" by V. D. Agrawal et al., pp. 57-61, IEEE Journal of Solid-State Circuits, vol. SC-17, No. 1, Feb. 1982.

Gopal Gupta and N. K. Jha, "A Universal Test Set for CMOS Circuits", IEEE Transactions on Computer-Aided Design, pp. 590-597, vol. 7, No. 5, May 1988.

R. Rajsuman et al., "Testing of Complex Gates", Electronics Letters, Jul. 30, 1987, vol. 23, pp. 813-814.

"Built-In Self-Test Structures", and Built-In Self-Test Techniques by Edward J. McCluskey, Stanford University, Apr. 1985, IEEE Design & Test, pp. 21-36.

"Test Length in a Self-Testing Environment" by T. W. Williams, pp. 59-63, IEEE Design & Test.

Primary Examiner—Jerry Smith
Assistant Examiner—Robert W. Beausoliel
Attorney, Agent, or Firm—Townsend and Townsend

[57] ABSTRACT

An apparatus for testing for faults in an integrated circuit is attached to sense lines which are coupled to output nodes of logic gates of a test structure within an integrated circuit, such as a "Cross-Check" test structure built into an integrate circuit apparatus. A related method provide precharging of the sense lines to a known signal level prior to using the sense lines to sense the signal level at a test point. The apparatus combined with sense amplifiers or comparators attached to the sense lines may adjust detection levels of the comparators synchronously to test for either an output "one" minimum level (VOH) or output "zero" maximum level (VOL) to test for other classes of faults. The apparatus attached to the sense lines may inject charge into an output node of a logic gate at preselected times in a test sequence to modify the signal level at that output node to test for faults. A method according to the invention includes path sensitization whereby test patterns can be reduced to Boolean expressions.

14 Claims, 4 Drawing Sheets

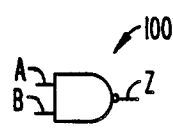
FIG._IA.
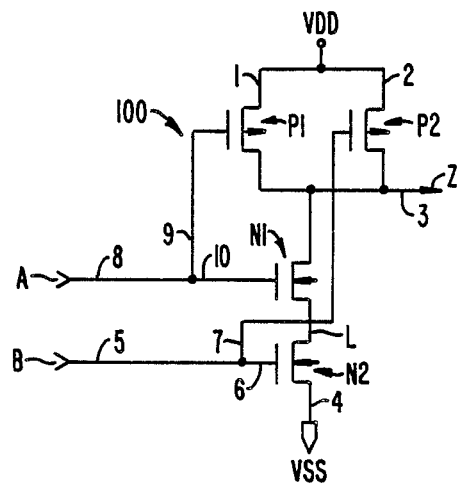
TYPICAL GATE UNDER TEST
FIG._IB.
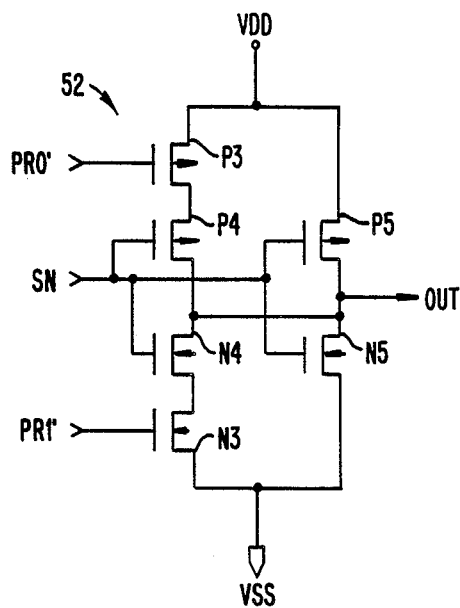
FIG._4A.
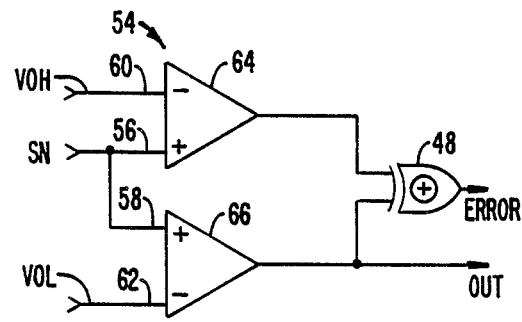
FIG._4B.

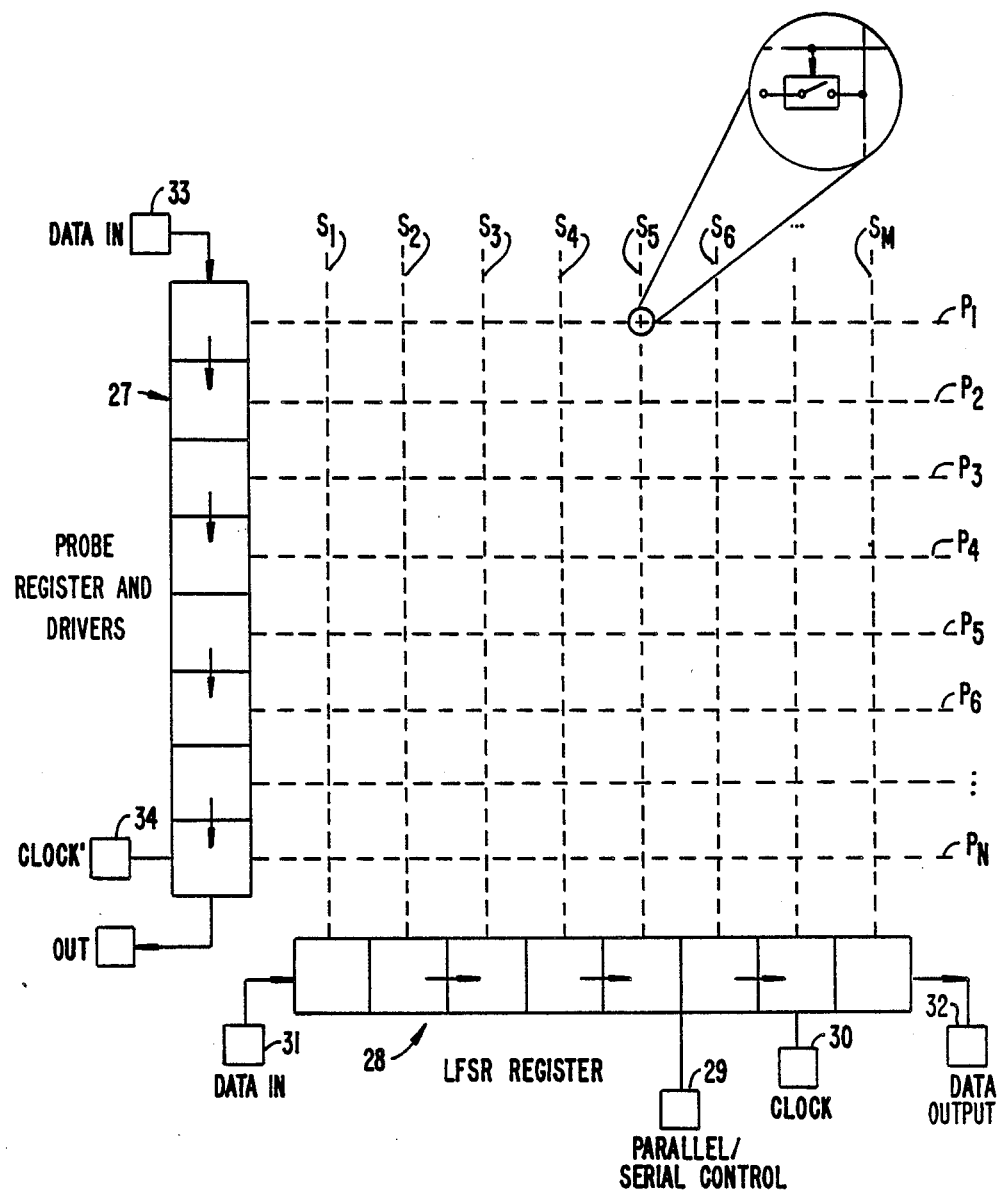
FIG._2.
(PRIOR ART)

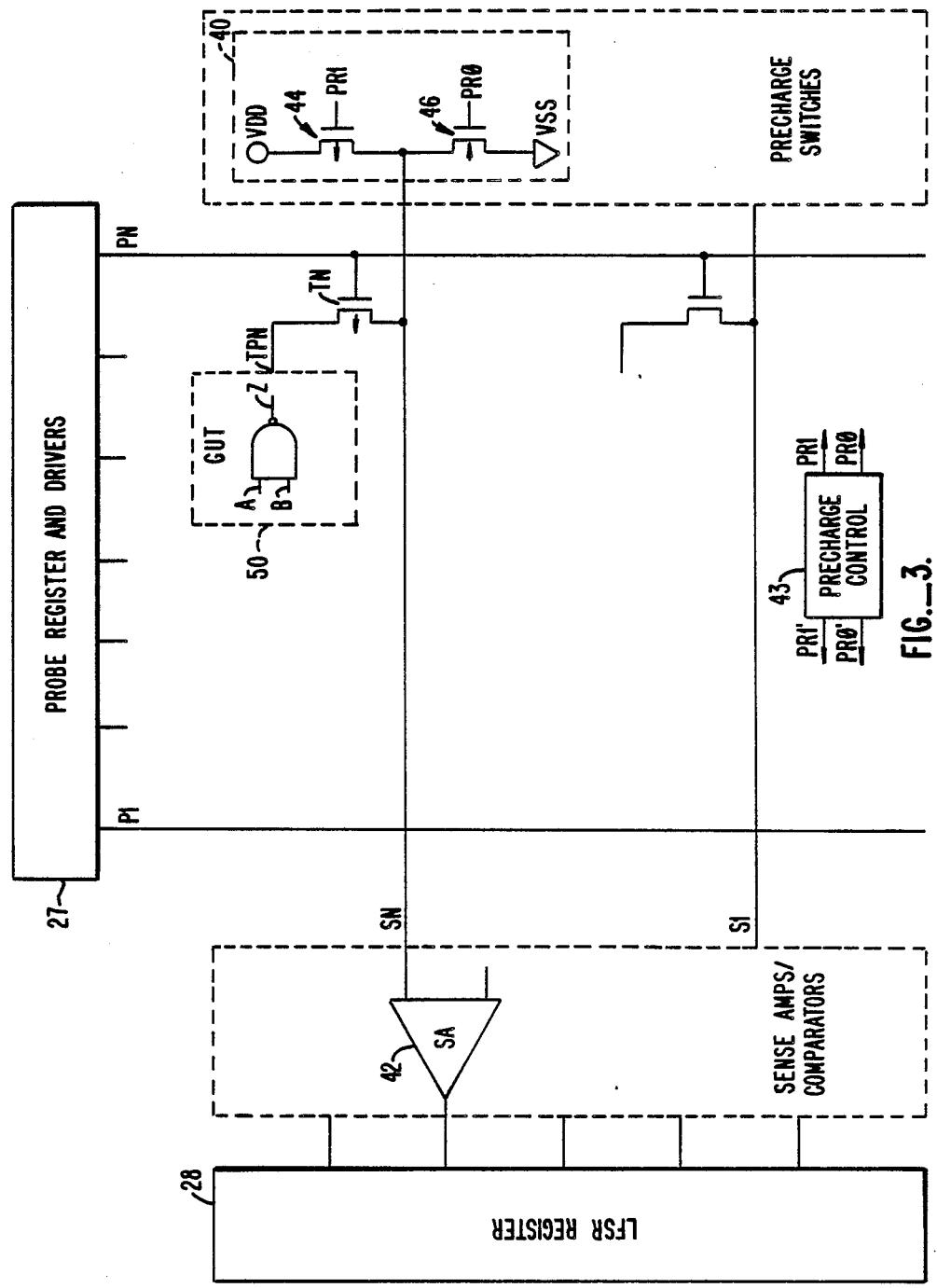
FIG._3.

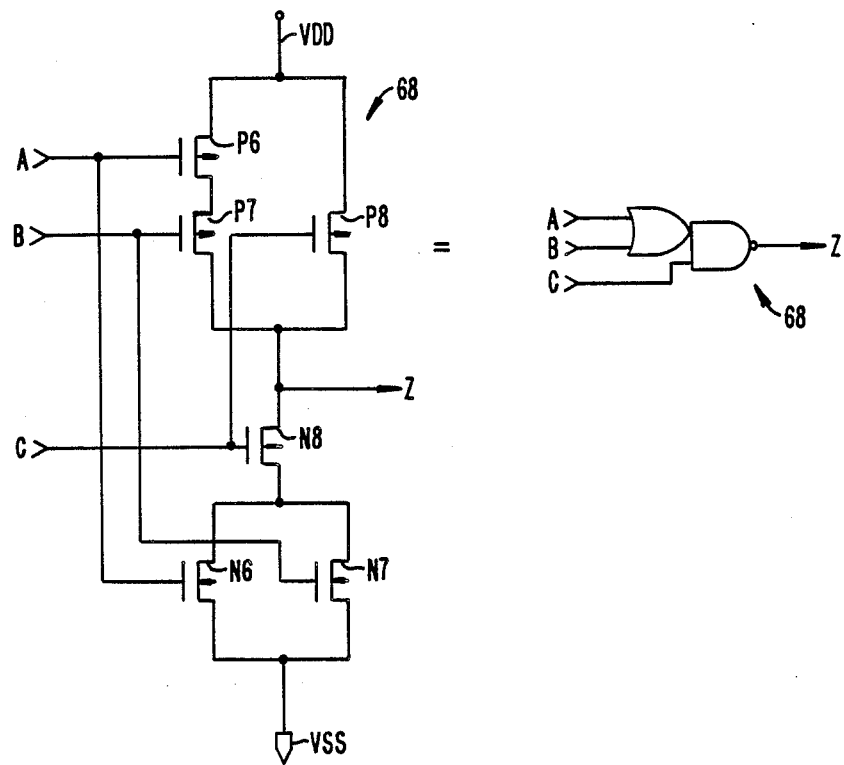
FIG._5.

METHOD AND APPARATUS FOR SENSING DEFECTS IN INTEGRATED CIRCUIT ELEMENTS

BACKGROUND OF THE INVENTION

1. Field of the Invention

This invention relates to testing integrated circuits and more particularly to improvements in the "Cross-Check" method of testing integrated circuits, which permits observation of the output node of every logic element on an integrated circuit of arbitrary combinatorial structure.

Complete testing for every defect requires controlling the output states of these nodes such that every sub-element (transistor, resistor, interconnect wire, etc.) of each logic gate is individually tested and not masked by the action of any other sub-element. This requires not only exercising every unique combinatorial state of a combinatorial logic element, but may require applying these states in certain sequential patterns to detect certain "stuck-open" faults which would otherwise be masked by the charge stored on the output node by a previous logic state.

The integration density of electronic systems is rapidly increasing due to the continuing progress in integrated circuit manufacturing technology. However, the number of pins or I/O ports to a system is growing a great deal less rapidly. This creates a problem in testing these systems, as greater amounts of test data must be funnelled through relatively few I/O ports. Additionally, the test data must traverse a continually deeper and more convoluted logical path, creating severe problems for the provision of test methods which can detect most defects.

Detecting a defect requires determining the fault that defect will create. The logic gate must then be operated or set up such that the sub-element in which the defect is located is exposed to the output in such a manner that it alone is responsible for either the correct output signal (e.g. a transistor which drives the output) or will interfere with correct operation if defective (e.g. a shorted transistor). This is done by activating all sub-elements in series with the sub-element under test and turning off all sub-elements in parallel with the sub-element under test. No known practical solution or algorithm exists to exercise and observe a logic gate in such a manner when it is embedded in a large circuit.

Definitions of the types of faults indicating defects are helpful.

An open circuit or "stuck-open" fault is a type of integrated circuit defect in which a transistor or interconnect is open circuited. These defects are difficult to detect because stored charge at the signal nodes may create a "false correct" signal at the time the output signal is observed. Correct testing for such defects requires driving the output signal to the opposite output logic level immediately prior to applying the test pattern. This assures the gate can then drive the signal back to the appropriate level being tested. This has been done in the past by creating a sequentially organized input stimulus pattern creating such a sequential pattern is often a very difficult or impractical task in a typical circuit.

An x-level fault is a fault in which the output of a logic gate does not reach a valid "one" (VOH) or "zero" (VOL) logic level. A common defect that could cause this condition to occur would be a short circuit, either internal to the gate or with another signal. Although the signal level is uncertain, the next stage of logic would consider it to be either a "one" or a "zero" depending upon the actual switching threshold of that next stage. Proper testing for x-level faults requires direct observation of the output signal levels of every gate. These outputs must have sufficient margin to assure that any arbitrary gate being driven by that node will properly detect the signal even under worst case operating conditions.

A short circuit is a type of integrated circuit defect in which one signal line or node is shorted to another, or to power or ground. Except for shorts to power or ground, these defects are very difficult to deterministically detect. Not only must every node in the circuit be compared with every other node to see when a defect would affect operation, but errors caused by these defects must be propagated to the test terminals. Rigorous determination of these conditions for large circuits has been considered impractical with even the largest computing resources. Additionally, some of these shorts may cause x-level or delay faults which are not readily determinable or detectable.

Noise margin is a measure of the degree to which an output signal exceeds the minimum electrical requirements for that signal to be considered a valid "one" or "zero" by the input port(s) of the logic gate(s) it is driving.

Output noise margin faults are similar to x-level faults in that an output node will not reach the maximum possible "one" or "zero" logic level. Instead it reaches a "one" or "zero" logic that, while valid, is insufficient to guarantee correct circuit operation in the presence of extraneous electrical noise such as that caused by other unrelated circuit switching.

Input noise margin faults are faults in which the input, while able to properly detect a valid logic signal level of value VOH or VOL, is unable to reliably detect such a signal in the presence of electrical noise. Valid input logic levels which are equal to VOH (VOL) reduced by noise are commonly referred to as VIH (minimum input logic level "one") and VIL (maximum input logic level "zero").

A delay fault is a defect causing the propagation delay of a gate or signal path to be extended sufficiently to cause incorrect operation under all or certain operating conditions. Delay faults are commonly caused by transistor defects such as transistor gates being open circuited and the transistor "stuck-on".

Stuck-at faults are defect models used to simplify characterizing the quality of the test patterns. This model assumes all defects will look like a short circuit to power or ground. This simple model is commonly used because more accurate models are impractical to use with limited computing resources. However, it does not represent an accurate model of manufacturing defects.

2. Description of Prior Art

A number of techniques have evolved which address the problems of testing large integrated circuits, notably Scan and BIST. Refer, for example, to "Built-in Self-Test Structures"; and "Built-in Self-Test Techniques" by Edward J. McCluskey, Stanford University, April 1985, *IEEE Design & Test*, pp 21-36; "Design for Testability - A Survey" by T.W. Williams and K. P. Parker, *Proc. IEEE*, Vol. 71, pp 98-112, Jan. 1983. These references describe and survey the use and applicability of these test methods.

These known techniques are severely strained at current state-of-the art manufacturing integration levels. They do not provide adequate testing, either in quantity or quality, for many possible manufacturing defects. Refer, for example, to "Test Length in a Self-Testing Environment" by T. W. Williams, pp 59-63, *IEEE Design & Test;* and "Fault Coverage Requirement in Production Testing of LSI Circuits" by V.D. Agrawal et. al., pp 57-61, *IEEE Journal of Solid-State Circuits.* Vol. SC-17, No. 1, Feb. 1982. These references describe the increasing necessity for improved fault coverage to simply maintain the same level of quality of shipped parts as the size of integrated circuits increases, and independently, as the manufacturing yield decreases.

Most presently available methods of testing are not capable of providing definitive coverage of all defects, and they are suited to testing for certain defects only with great difficulty. For example, open MOS device defects may respond correctly to certain test patterns but not to others. Avoiding these false good measurements have in the past required the input of certain sequential patterns. For instance, two-pattern tests may be necessary even for simple gates. The first pattern sensitizes the output to an initial state and the other drives it to the opposite state for checking. Such patterns are described by Gopal Gupta and N.K. Jha in "A Universal Test Set for CMOS Circuits", *IEEE Transactions on Computer-Aided Design,* pp 590- 597, Vol. 7, No. 5, May 1988. Creation and generation of sequential test patterns at signal inputs is very difficult and time consuming and also requires expensive computing power.

R. Rajsuman et al. describe a path sensitization scheme in "Testing of Complex Gates", *Electronics Letters.* July 30, 1987, Vol. 23, pp. 813–814. However, there is no suggestion therein of how to use path sensitization to derive test sets or other features and advantages of the present invention relating to test sensitization.

Dr. Tushar R. Gheewala has proposed a technique referred to as the "Cross-Check" method for testing integrated circuits which provides a higher level of test coverage. Information about this technique and products supporting this test method are available from Cross-Check Technology of San Jose, Calif. A description of features of the Cross-Check technology is found in U.S. Pat. No. 4,749,947 issued 6/7/88. This patent describes the Cross-Check technique, illustrating how, with the addition of extra apparatus and methods, the Cross-Check technique can be extended to test for all common defects.

The Cross-Check technique requires that a circuit structure be incorporated in an integrated circuit which cooperates with a software methodology. The combination provides enhanced testability by producing a very high level of observability of internal nodes of an integrated circuit. What is needed are enhancements to the Cross-Check technique to identify circuit defects which are difficult to detect by exercising input nodes and merely observing output nodes.

SUMMARY OF THE INVENITON

According to the invention, in a device constructed to take advantage of the "Cross-Check" test structure, an apparatus and a related method provide precharging of sense lines to a known signal level immediately prior to using the sense lines to sense the signal level at a test point. This eliminates the need for applying specific sequential patterns to input terminals of tested structures to detect "stuck-open" faults.

In addition according to the invention, apparatus adjust detection levels of the comparators or sense amplifiers connected to the sense lines, synchronously with the precharge levels to test for either an output "one" minimum level (VOH) or output "zero" maximum level (VOL) (i.e., the comparators are set to detect VOH immediately after precharging to a zero level and viceversa). This tests for output noise margin faults.

Still further according to the invention apparatus attached to the sense lines inject charge into an output node of a logic gate at preselected times in a test sequence to modify the signal level at that output node. This injected charge is used to detect input noise margin faults in integrated circuits.

Furthermore, methods according to the invention use Cross-Check structures to test for other common failure modes, including x-level faults, delay faults and shorted nodes (bridging faults).

Finally, methods according to the invention use a principle herein referred to as path sensitization to rapidly and unambiguously determine the fault modes of a logic gate in the presence of various defects when exercised by input patterns in concert with this precharging apparatus. The sum of these fault modes is the fault model of the logic gate which is used to define the patterns necessary to test the logic gate for various faults, and conversely, to determine which defects may be present in the logic gate as determined by the types of failures observed.

This invention provides an enhancement of the "Cross-Check" test technique to test for all common defects in integrated circuits. Detecting a defect requires determining the fault (failure mode) that defect will create. These defects can be classified as open circuits or short circuits, partially or completely, and cause the following failures, or faults, at any circuit node: stuck-open, stuck-closed, shorted to another node, noise margin, x-level and delay faults. The invention will be better understood by reference to the following detailed description in connection with the accompanying drawings.

BRIEF DESCRIPTION OF THE DRAWINGS

FIG. 1A is a logic symbol of a 2-input NAND gate.

FIG. 1B is the transistor level schematic of the 2-input NAND gate.

FIG. 2 is a block diagram of a basic "Cross-Check" probe line and sense line structure.

FIG. 3 illustrates additional circuitry, including a precharge element and a sense amplifier/comparator, representing the teachings of the present invention, added to the structure of FIG. 2.

FIGS. 4A and 4B illustrate two embodiments of comparators which can be attached to the sense lines.

FIG. 5 illustrates the logic symbol and CMOS schematic implementation of an OR-NAND gate 68.

DETAILED DESCRIPTION OF THE DRAWINGS

FIGS. 1A and 1B show a 2-input NAND gate 100 for any conventional CMOS (Complementary Metal-Oxide-Semiconductor) technology. FIG. 1A is the symbol, FIG. 1B is the schematic. A and B are signal inputs, and Z is the signal output. N1 and N2 are n-channel MOS Field Effect Transistors (MOSFETs) and P1 and P2 are p-channel MOSFETs, with the conventional gate, drain and source electrodes. L is an internal node.

The various defects that can occur in an integrated circuit gate, particularly during manufacturing, are as follows:

| DEFECT TYPE | NUMBER POSSIBLE |
|---|---|
| (A) Stuck Open FETS | 4 |
| (B) Stuck Closed FETS | 4 |
| (C) Shorts to Power or Ground | 8 |
| (D) Internal Node-Node Shorts | 6 |
| (E) Interconnect Open Circuits | 10 |

Existence of any of these defects may cause one or more of the faults described hereinabove. Defect types (A) and (B) refer to the four MOSFETs: N1, N2, P1, and P2. Defect type (C) refers to the four nodes: input nodes A and B, output node Z, and internal node L. Each of these nodes can be shorted to either VDD or VSS for a total of eight possible defects. Defect type (D) refers to the same nodes as in (C). There exists six possible additional shorts: A to B, A to Z, A to L, B to Z, B to L and L to Z. Defect type (E) refers to all possible interconnect opens in each separate series interconnect path. These interconnects are identified as elements 1 through 10 on the schematic, FIG. 1B.

FIG. 2 is a block diagram of a basic "Cross-Check" probe line and sense line structure. It illustrates how probe lines (P1-PN) and sense lines (S1-SN) are matrixed and connected to the probe drivers of a probe register 27 and of a LFSR (Linear Feedback Shift Register) 28. According to the invention, circuitry is added to the basic structure of FIG. 2. FIG. 3 illustrates additional circuitry, including precharge elements 40, sense amplifier/comparator elements 42, and precharge control means 43, representing the teachings of the present invention, which are added to the "Cross-Check" structure of FIG. 2. P1 through PN represent the probe lines. S1 through SN represent the sense lines. According to the invention, a GUT (Gate Under Test) 50, which in this example is a 2-input NAND gate similar to that described in FIG. 1, is connected to a representative sense line SN through a representative switch TN at a test point TPN in the GUT 50. The test point TPN is typically the output node Z, but test points may be at any internal node of the GUT, including input nodes.

Each precharge element 40 comprises a first FET switch 44, coupled between power (VDD) and the sense line SN, and a second FET switch 46, coupled between ground (VSS) and the sense line SN. PR1 is a signal line to the first FET switch 44 which carries a signal from the precharge controller 43 which drives the gate of the p-channel FET 44. PR0 is a signal line which carries a signal from the precharge controller 43 which drives the gate of the n-channel FET switch 46 connected between a sense line (SN) and VSS (ground). Similar switching arrangements are provided between every sense line $S_{31}$ and VDD and VSS and driven by the same or similar signals. All the sense lines are terminated in individual receiver circuits or Sense Amplifiers (e.g. SA) 42 which can measure the signal levels present on the sense lines. Various types of receivers can be used here. These include, but are not limited to, precise operational amplifiers, comparators, Schmitt triggers or even simple inverters. Each SA 42 is coupled to a corresponding cell of the LFSR register 28. The precharge switches 40 are typically associated with only the sense lines and not the probe lines or associated probe register and drivers 27.

According to the invention, when the proper logic level is applied to PR1 or PR0, the respective sense line(s) are driven (precharged) to VDD ("one") or VSS ("zero"), respectively Subsequently, the switch TN may be exercised to connect the GUT to the sense line SN. An abnormal signal change on sense line SN, one which occurs which is not expected or which does not occur which was expected, indicates a fault pointing to a defect.

The precharge control means 43 comprises apparatus to control injection of charge into the addressed output node of the GUT 50 at times preselected in a user-defined test sequence to modify the signal level at that output node. This injected charge is used to test noise margin, among other defects.

FIGS. 4A and 4B illustrate two embodiments of comparators 52, 54 which can be attached to the sense lines. FIG. 4A illustrates a comparator of the inverter type 52 which includes transistors such that it will switch at different input voltage levels at SN depending on the logic states of PR0' and PR1' from the precharge control means 43. The logic states established by PR0' and PR1' thus select between functional subsections of the comparator 52. Thereby, the precharge control means 43 can adjust detection levels of the comparators 42 synchronously but out of phase with the precharge levels to test for either an output "one" minimum level (VOH) or output "zero" maximum level (VOL) (i.e. the comparators are set to detect VOH immediately after precharging to a zero level and vice-versa). This tests for output noise margin faults.

FIG. 4B illustrates a dual comparator embodiment comprising a first comparator 64, a second comparator 66 and an EXCLUSIVE-OR gate 48 having its two inputs coupled to receive the outputs of the respective first and second comparators 64, 66. A sense line SN is coupled to noninverting terminals 56, 58 connected in common. A first comparator inverting terminal 60 is for connecting to a first voltage reference terminal VOH, and a second comparator inverting terminal 62 is connected to a second voltage reference terminal VOL. A signal output from the EXCLUSIVE-OR gate indicates an error. Operation is explained in greater detail hereinbelow.

The structure and techniques according to the invention may be used to readily detect certain classes of defects. The operation of the invention is explained hereinbelow.

Stuck-open Detection

This invention eliminates the need for sequentially organized test patterns for testing stuck-open faults by precharging the sense lines prior to the sampling of signals. Prior to detecting the signal levels on the sense lines (S1-SN) (FIG. 3), the electronic switches (e.g., TN) connecting the test points (e.g., TPN) to the sense lines are opened. The sense lines S1 through SN are then precharged to a "one" level. The precharge is then disabled, and the switches TN are closed. After a settling period, the values on the sense lines are sensed by the appropriate sense amplifier/comparator. This process is then repeated with the sense lines first precharged to a "zero" level. This dual precharge and sampling system makes the detection independent of whether a "one" or "zero" signal level was supposed to be detected. One of the precharge cycles will precharge to the incorrect logic level, one that is opposite in sense to that of the GUT being tested. After that precharge cycle, the GUT 50 being sampled must be able to actively drive the sense line SN from an incorrect logic level to the correct logic level.

It is to be noted that the electronic switches (TN) noted above need not be opened during precharge to achieve accurate results, but power drain may be excessive if they are not opened.

X-level Detection

The Sense Amplifiers (SA) 42 shown in FIG. 3 are used to detect x-level faults. For most applications, either two comparators 64, 66 or one programmable comparator 52 may be used, as shown in FIGS. 4A and 4B in place of conventional sense amplifiers 42, as shown by way of a single example in FIG. 3. In the case of two comparators, one of the comparator reference levels is set at the worst case VOL to detect a defective "zero" level. The other is set to the worst case VOH to detect a defective "one" level. These comparators need not be anything more complex than inverters whose switching thresholds are adjusted to worst case "one" and "zero" levels. If a single programmable comparator 52 is used, the comparator threshold levels are set by the precharge control means 43 to the worst case VOL when the sense lines are precharged to "one". They are then reset to the worst case VOH when the sense lines are precharged to "zero".

If an FET is used as a switching element, the logic signals on the probe lines may require a voltage level that is either higher than VDD or lower than VSS to assure a full VDD-VSS voltage swing on the sense lines.

FIG. 4A illustrates a CMOS inverter comparator whose switch point (input threshold) is controlled by two signals, PR0' and PR1'. If a negative signal is applied at PR0', turning ON p-channel transistor P3, while a negative signal is also applied at PR1', turning OFF n-channel transistor N3, the input threshold voltage level at terminal SN is raised. With proper selection of transistor gain or device size, this level can be adjusted as desired within the switching range. Similarly, if a positive signal is applied to P3 and N3, turning OFF transistor P3 and turning ON transistor N3, the switch point is adjusted to a lower level. These signals can be synchronized with the precharge cycle to automatically test for VOH (VOL) during the precharge-to-a-zero (precharge-to-a-one) cycle.

FIG. 4B illustrates the use of two comparators. One comparator is set at VOH and the other at VOL. If the signal is ever between VOL and VOH, the outputs of the two comparators will not be identical. This will cause the output of the Exclusive-OR gate, 48, to go high indicating an x-level fault error. Note that the output of the Exclusive-OR gate will only detect an x-level fault, not other defects such as a short to VDD. A direct connection to either of the comparator outputs will detect such "hard" faults. Such an error signal is useful in diagnostic evaluations of defects.

It is within the contemplation of the invention to use a Schmitt trigger. A Schmitt trigger is essentially a comparator with dual comparator levels or hysteresis. The last reading is effectively latched until the other level is exceeded. This creates a dead zone between the two levels, making Schmitt triggers sensitive to the signal polarity and direction. Schmitt trigger detection therefore requires pre-driving the signal level to the opposite polarity of the signal to be detected prior to measuring the signals with the Schmitt trigger. Precharging the sense lines as described above prior to measuring with the Schmitt trigger is required for proper detection of x-level faults.

Various methods may be used to logically process the sense amplifier or comparator outputs. For example, the data may be stored in a digital memory and checked later. Dual comparator outputs may be compared for differences or the two readings generated during the dual precharge may be compared. Nothing in this disclosure is meant to limit processing techniques.

A single precharge system to an x-state (e.g., halfway between VDD and VSS) can be used instead of a dual one-zero precharge system if implemented in connection with a compatible detection system. A suitable detection system is an x-detection system wherein a dual comparator or an adjustable level inverter is employed in the sense circuitry. Correct operation of a GUT is indicated when the GUT successfully actively drives the sense line from its precharge x state to an expected one or zero state. A dual cycle would be required if a dual comparator is not used.

Noise Margin

Noise margin is a measurement of the extent to which a logic gate output signal exceeds the minimum requirements to be properly detected at another logic gate input as a valid logic level. Measurement of noise margin requires measuring both the signal level of a logic gate output and the input signal sensitivity of the gate being driven. Permitted valid output and input levels can be independently specified as VOH (VOL) and VIH (VIL). The difference between the specified VOH (VOL) and VIH (VIL) is designated as the noise margin. Alternatively, noise margin may be directly specified as the difference between VOH (VOL) and VIH (VIL) without specifying VOH (VOL) and VIH (VIL) directly.

For the case of independently specified VOH (VOL) and VIH (VIL) levels, VOH (VOL) can be measured using the apparatus and methods as described above for x-level detection to make certain that no defect exists which would cause the output signal to fall outside of its specified values. VIH (VIL) can be determined by varying the input levels of the logic gate under test by injecting charge into the input signals (via the precharge apparatus and the electronic switch at the output node of the previous logic gate driving that input) and measure the output of the logic-gate-under-test to determine the point at which the output level changes.

If noise margin has been directly specified, a fixed amount of "noise" can be injected into the input signal of a gate (the output of the previous gate as described above) and its output signal measured.

Noise can be injected by turning ON the sense and precharge transistors simultaneously. Alternately, if the capacitance of the sense lines is high as compared to the logic gate output capacitance, noise will be injected for a finite time, decaying to zero at a known rate after the sense transistor is turned on. Control of the drive (or size) ratio of the sense and/or precharge transistors, and/or timing of the measurement if the precharge transistors have been turned off, will determine the amount of noise injected.

Cross-Check circuitry and the sense amplifiers or comparators described above can then be used to determine the exact noise margin or to determine if the noise margin exceeds a predetermined value as described above.

Alternatively, a fixed amount of "noise" can be injected while the circuit is switching and a measurement made to determine if the circuit switched properly.

Delay Faults

Delay faults can be detected indirectly by observing the effects of a delay fault. Delay faults cause incorrect circuit operation or incorrect signal timing at an input-/output (I/O) port (i.e., integrated circuit (I/O) pins). Incorrect timing at an I/O port may be tested using conventional testers and test techniques. Incorrect circuit operation will cause an error that can be detected by observing the state of the circuit after every test vector which has been determined to be sensitive to speed. For example, a register-to-register transfer of a signal can be determined to be speed sensitive. If the signal path delay becomes longer than one clock cycle, the proper signal will not be latched in the register. A delayed signal can also cause a "glitch" which might clock or reset a register. Again this will be observable. All delay faults which affect circuit operation will eventually be captured by some latch or register on the circuit or be observable on an I/O port. If any defect causes a signal to be delayed and if it does not result in a circuit malfunction or cannot be observed directly on the I/O ports, it is not a delay fault, as it will not have any demonstrably negative effect on circuit operation.

Delay faults are detected by operating the circuit at full speed up to the test vector to be examined. The states of all the nodes are then examined to determine if any are incorrect. The test pattern should be examined to determine if all worst case speed paths are exercised at some point during the test. The test may be made only for predetermined speed paths. Alternately, a complete test may require as many test passes as there are test vectors, each test pass starting at the beginning of the test sequence and clocking one more vector than the previous pass.

Shorts (bridging defects)

Any short between two nodes, whether internal to the logic gate or to another logic gate, will cause at least one of the nodes to be at either the wrong logic level or an x-level during that time when the shorted nodes are required to be at different logic levels. These are commonly referred to as bridging defects. These can readily be detected by the Sense Amplifiers or comparators as described above. The methods for detecting them are explained below.

Shorts internal to a logic gate

The test patterns required to detect short circuit defects internal to a logic gate are generated using a method similar to the one used for detecting open circuits. The nodes to be tested for shorts are selected. By proper selection of input signals, one of the nodes is set such that it is driven to VDD while the other is driven to VSS. Thus, if there were a short circuit, the output test node will be connected to both VDD and VSS causing an incorrect logic level or an x-state, which will be detected by the sense amplifiers as a fault.

For example, in the NAND gate of FIG. 1, a potential short in device P1 (or any other short from VDD to Z) can be detected by applying the test pattern AB=[11] which would produce a "zero" if there was no short in P1, but a "one" or x-state if there is a short on P1. A short from L to Z can be tested for by setting Z to "One" and L to VSS. This is done by applying the pattern AB=[01], Turning on P1 and N2 and turning off N1.

External node-to-node shorts

One hundred percent testing of all possible shorts requires verifying that no two signals are identical during every test vector. Cross-Check circuitry along with the apparatus and methods described herein will detect any short between any pair of nodes if they are ever in complementary logic states, as such a short will cause an x-state or incorrect logic level on at least one of the nodes. Checking for such complementary states can readily be done by computer analysis of the test patterns. Extra test vectors can be added as needed.

Path Sensitization and Fault Modeling:

In order to test for every potential open circuit fault, all the distinct paths that connect the test node to either a power supply (VDD or VSS) or another signal input node must be individually tested. The test patterns required to test opens are derived by: selecting a sub-element (or path) for open circuit test; applying appropriate test patterns to the gate under test such that the selected sub-element as well as all the other sub-elements in the series path with the selected sub-element between the output test node and the signal input node or power supply are all ON; and opening all alternate paths between the output test node and power supplies or signal input node. Once the selected path is sensitized as described above, the output test node can be precharged to "one" or "zero" to test for open circuit. This process is repeated for all possible open faults to obtain a full coverage of open faults.

For example, for the NAND gate shown in FIG. 1, three different input patterns are required for full open circuit coverage: AB=[01 ], [10]and [11]. For AB=[01], P1 and N2 are ON and P2 and N1 are OFF. Thus, P1 is the only closed path that exists between output Z and VDD. If P1 is OFF because of a defect, or is open circuited, no path exists between Z and VDD. The output will not rise to a "one" after a precharge to a "zero" was applied. Precharging to a "zero" is necessary to detect the defect. Similarly, a [10]input is needed to detect an open condition in the branch containing P2. Detecting opens in the path containing N1 and N2 requires both N1 and N2 to be ON, i.e., input pattern [11]. If either transistor is open or OFF, Z will not be able to be driven to "zero". Thus, precharging to a "one" is necessary to deterministically detect an open in the path containing transistors N1 and N2.

This method can be generalized such that path sensitization, and therefore the minimum universal test set can be calculated solely from the Boolean expression of the gate. Z is set to be controlled by each selected input in turn (e.g., in CMOS circuits, Z will be the inversion of the selected input only). That input is then tested by making it equal first to a "one" then to a "zero" (or vice versa). Z will first be equal to a "zero" for each input, then a "one", following the input. After repeating the process and discarding redundant patterns, the resulting pattern set is a full test set capable of fully exercising the gate and capable of detecting all opens. The patterns need not be described in the conventional manner of a set of "ones and zeros". They can be a set of Boolean expressions in which any of a number of independent conditions may sensitize the path. Also, the patterns are not related in any sequential sense to one another. The test is valid and complete as long as each pattern is applied at least once anytime during the test. This is solely due to the fact that the output is precharged and continually monitored. The reference by G. Gupta, above, describes the more complicated test sets required if the precharging apparatus and method described in this invention is not used.

For example, the Boolean expression for the two input NAND gate is Z=NOT(AB). Setting Z=NOT(A) requires setting B ="one". This results in two test patterns: AB=[01]and AB=[11]. Setting Z=NOT(B) requires setting A="one". This results in the two test patterns: AB=[10]and AB=[11]. The pattern AB=[11]is duplicated, indicating it will detect two open circuit errors. The net result is the same three patterns described above.

In FIG. 5, a more complex CMOS circuit is shown. This gate can be described by the equation Z=NOT(-(A+B)C). Based on the method described above, a set of four test patterns (i.e., ABC=[001],[101], [011], and-[(A+B)=1, C=0]) are required to completely test the circuit for open circuit defects when the precharge method described herein is used.

The present invention permits derivation and use of much simpler test patterns as compared to those described in the initial reference by G. Gupta. In particular, test sets need no longer be limited to patterns of "ones" and "zeros", but are now composed of Boolean expressions. Describing the test set in Boolean expressions is a much more powerful and versatile method because in complex gates, any of several test sets will be able to fully test the device under test.

The invention has now been explained with reference to specific embodiments. Other embodiments will be apparent to those of ordinary skill in the art in light of this description. For example, various methods using pullup or pulldown devices attached to the sense lines can be conceived using active or passive components to bias signal lines during sampling. Such methods measure the drive of the output signal at the test point and can be used to test for stuck-opens and x-level detection. This disclosure is meant to be inclusive of any means used to precharge or bias sense lines whether prior to sampling or during sampling of the signals. Additionally, while examples are given using CMOS technology, similar techniques may apply to various other technologies such as bipolar and Gallium Arsenide. Therefore, it should be understood that the invention is not to be limited, except as indicated by the appended claims.

What is claimed is:

1. A method for testing for faults in an integrated circuit, said integrated circuit including sense lines which are connected to test nodes of a test structure for logic gates within an integrated circuit, said method comprising:

precharging the sense lines with a preselected electric charge; thereafter sensing final state of a signal on each sense line as a result of electrically coupling a logic gate to the sense line in the presence of stored charge on the sense line, wherein the preselected electric charge corresponds to a voltage level having a logic value which is opposite in sense to a predicted logic value on a test node, said test node being connected to the sense line through a switch, wherein said predicted logic value is a result of correct operation of the logic gate connected to said sense line.

2. The method according to claim 1 further including the step of adjusting detection levels of comparators used for sensing said charges, said adjusting being synchronous with said precharging step.

3. A method for testing for faults in an integrated circuit, said integrated circuit including sense lines which are connected to test nodes of a test structure for logic gates within an integrated circuit, said method comprising:

precharging the sense lines with a preselected electric charge; thereafter sensing final state of a signal on each sense line as a result of electrically coupling a logic gate to the sense line in the presence of stored charge on the sense line.

further including the step of injecting charge into an output node of a logic gate to modify signal level at said logic gate output node for use to test noise margin faults.

4. A method for testing for faults in an integrated circuit said integrated circuit including sense lines which are connected to test nodes of a test structure for logic gates within an integrated circuit, said method comprising:

precharging the sense lines with a preselected electric charge; thereafter sensing final state of a signal on ech sense line as a result of electrically coupling a logic gate to the sense line in the presence of stored charge on the sense line, further including the step of injecting charge into an input node of a logic gate to modify signal level at said logic gate input node.

5. A method for sensitizing a path for testing for open faults in an integrated circuit, said integrated circuit including sense lines which are coupled to test nodes of a test structure for logic gates within an integrated circuit, said method comprising:

(a) selecting a path for an open circuit test;

(b) applying test pattern signals to a signal input node and to said selected path to preset elements between said signal input node and an output test node to a presumed state;

(c) thereafter, precharging the sense lines with a preselected electric charge; and (d) sensing changes of signals on the sense lines as a result of electrically connecting the output test node to the sense lines in the presence of precharge on the sense lines.

6. The method according to claim 5 further including the step of repeating steps (a) through (d) for each possible open fault to obtain full coverage of open faults in said integrated circuit.

7. A method for sensitizing a path for testing for open faults in an integrated circuit, said integrated circuit including sense lines which are coupled to test nodes of a test structure for logic gates within an integrated circuit, said method comprising the steps of:

(a) selecting a sub-element and path for an open circuit test;

(b) applying test pattern signals to signal input nodes of said integrated circuit so as to exercise said selected sub-element and said selected path and to preset all elements between said output test node and said signal input node and between said output test node and power supplies to an ON state and to preset alternate paths between said signal input node and between said output test node and power supplies to an OPEN state;

(c) thereafter, precharging the sense lines with a preselected electric charge; and (d) sensing changes of signals on the sense lines as a result of electrically connecting the output test node to the sense lines in the presence of precharge on the sense lines.

8. The method according to claim 7 further including the steps of:

repeating steps (a) through (d) for each possible open fault to obtain full coverage of open faults in said integrated circuit; and reducing a description of test patterns to Boolean expressions.

9. An apparatus for testing for faults in an integrated circuit, said integrated circuit including sense lines which are coupled to test nodes of a test structure for logic gates within an integrated circuit, said apparatus comprising:

means coupled to the sense lines for precharging the sense lines with a preselected electric charge; and means coupled to the sense lines for sensing state of signals on the sense lines as a result of electrically coupling a logic gate to the sense line in the presence of stored charge on the sense line, wherein said precharging means comprises a first controllable switch coupled between a power source and one of the sense lines, a second controllable switch coupled between ground and said one of the sense lines, and means for controlling switching of said first controllable switch and said second controllable switch relative to one another and relative to operation of the logic gates.

10. The apparatus according to claim 9 wherein said sensing means comprises a sense amplifier or a comparator.

11. An apparatus for testing for faults in an integrated circuit, said integrated circuit including sense lines which are coupled to test modes of a test structure for logic gates within an integrated circuit, said apparatus comprising:

means coupled to the sense lines for precharging the sense lines with a preselected electric charge; and means coupled to the sense lines for sensing state of signals on the sense lines as a result of electrically coupling a logic gate to the sense line in the presence of stored charge on the sense line, wherein said sensing means comprises a first comparator and a second comparator, said first comparator having a first noninverting input, said second comparator having a second noninverting input, said first noninverting input being coupled in common to said second noninverting and to said one of the sense lines.

12. The apparatus according to claim 11 further including a two-input EXCLUSIVE-OR gate having a first input coupled to an output of said first comparator and a second input coupled to an output of said second comparator for generation of a TRUE output signal whenever voltage on said sense line is between upper and lower threshold levels of said first and second comparators indicative of an x-level fault.

13. An apparatus for testing for faults in an integrated circuit, said integrated circuit including sense lines which are coupled to test nodes of a test structure for logic gates within an integrated circuit, said apparatus comprising:

means coupled to the sense lines for precharging the sense lines with a preselected electric charge; and means coupled to the sense lines for sensing state of signals on the sense lines as a result of electrically coupling a logic gate to the sense line in the presence of stored charge on the sense line, wherein said sensing means comprises a first circuit element, a second circuit element, first switch means coupled to said first circuit element for controlling voltage switching at a first voltage level in response to a voltage on said one of the sense lines, and second switch means coupled to said second circuit element for controlling voltage switching at a second voltage level in response to a voltage on said one of the sense lines of said first circuit element and of said second circuit element.

14. An apparatus for testing for faults in an integrated circuit, said integrated circuit including sense line switch are coupled to test nodes of a test structure for logic gates within an integrated circuit, said apparatus comprising:

means coupled to the sense lines for precharging the sense lines with a preselected electric charge; and means coupled to the sense lines for sensing state of signal on the sense lines as a result of electrically coupling a logic gate to the sense line in the presence of stored charge on the sense line, wherein said sensing means comprises a Schmitt trigger for generating an output signal indicative of x-level faults.

* * * * *